(12) United States Patent
Kwan et al.

(10) Patent No.: US 8,704,596 B2
(45) Date of Patent: Apr. 22, 2014

(54) DIFFERENCE AMPLIFIER ARRANGEMENT WITH TRANSCONDUCTANCE AMPLIFIER BASED CURRENT COMPENSATION

(75) Inventors: Kai Kwan, Tustin, CA (US); Peter Kim, Huntington Beach, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 111 days.

(21) Appl. No.: 13/462,892

(22) Filed: May 3, 2012

(65) Prior Publication Data

US 2012/0326785 A1 Dec. 27, 2012

Related U.S. Application Data

(60) Provisional application No. 61/499,703, filed on Jun. 22, 2011.

(51) Int. Cl.
*H03F 3/45* (2006.01)
(52) U.S. Cl.
USPC .............................. 330/252; 330/69
(58) Field of Classification Search
USPC .......................... 330/252–261, 69
See application file for complete search history.

(56) References Cited

U.S. PATENT DOCUMENTS

| 7,126,377 | B2 | 10/2006 | Brooks et al. | |
|---|---|---|---|---|
| 7,342,450 | B2* | 3/2008 | Jones | 330/253 |
| 7,592,871 | B1 | 9/2009 | Dasgupta | |
| 2002/0190782 | A1 | 12/2002 | Somerville et al. | |
| 2010/0182086 | A1 | 7/2010 | Cozzolino | |

* cited by examiner

*Primary Examiner* — Hieu Nguyen
(74) *Attorney, Agent, or Firm* — Simon Kahn

(57) ABSTRACT

An amplifier arrangement constituted of: a first input lead; a second input lead; a difference amplifier; a first buffer, the input of the first buffer coupled to the first input lead, the output of the first buffer coupled to a first input of the difference amplifier; a second buffer, the input of the second buffer coupled to the second input lead, the output of the second buffer coupled to a second input of the difference amplifier; and a transconductance amplifier, the non-inverting input and the non-inverted output of the transconductance amplifier coupled to the first input of the difference amplifier, the inverting input and the inverted output of the transconductance amplifier coupled to the second input of the difference amplifier. The input signals are thus buffered and the offset of the buffers are compensated for.

13 Claims, 4 Drawing Sheets

DIFFERENCE AMPLIFIER ARRANGEMENT WITH TRANSCONDUCTANCE AMPLIFIER BASED CURRENT COMPENSATION

CROSS-REFERENCE TO RELATED APPLICATION

This application claims priority from U.S. Provisional Patent Application Ser. No. 61/499,703 filed Jun. 22, 2011, entitled "Difference Amplifier Arrangement with Transconductance Amplifier Based Current Compensation", the entire contents of which is incorporated herein by reference.

BACKGROUND OF THE INVENTION

The present invention relates to the field of difference amplifiers, and in particular to a difference amplifier arrangement comprising an input buffer and a transconductance amplifier to provide current compensation.

BACKGROUND OF THE INVENTION

An operational amplifier, often written as Op Amp, can be configured to perform different tasks depending on the application. Referring to FIG. 1, one of these configurations is as a difference amplifier 10, wherein a feedback resistor, denoted R2 is provided from the output of an Op Amp 20 to the inverting input of Op Amp 20. A second resistor R2, typically of the same value as feedback resistor R2, is provided between the non-inverting input of Op Amp 20 and a common potential, illustrated without limitation as ground. Additionally, a matched pair of resistors R1 are provided, a first end of each of which are coupled respectively to the inverting, and non-inverting inputs of Op Amp 20. The second end of each resistor R1 provides a lead, denoted respectively INPUT1, INPUT2, for connection to a first end of each of the two signal sources, denoted respectively VS1 and VS2, and a second end of each of the two signal sources are connected to the common potential. For clarity, the internal source resistance of the each of the two signal sources are illustrated, denoted respectively RS1 and RS2.

The output of Op Amp 20, representing the output of difference amplifier 10 and denoted VO, neglecting internal source resistances RS1 and RS2, is determined as:

$$VO = R2/R1 * (VS2 - VS1) \quad \text{EQ. 1}$$

The input resistance, RIN, of difference amplifier 10, is determined as:

$$RIN = 2*R1 \quad \text{EQ. 2}$$

In the presence of finite internal source resistance RS1 and RS2, VO is determined as:

$$VO = (-R2*VS1)/(R1+RS1) + VS2*(1+(R2/R1+RS2))/(1+(R1+RS2)/R2) \quad \text{EQ. 3}$$

In the event that R1>>RS1 and R2>>RS2 then EQ. 3 simplifies to EQ. 1.

The above classic difference amplifier configuration has advantages and disadvantages. The biggest advantage is the simplicity of the design, but one of the disadvantages is that the sources driving the inputs need to have very low source resistance, in order for EQ. 3 to simplify to EQ. 1. Unfortunately, this is not always practical.

In the absence of sources driving the input with very low source resistance, the prior art further suggests the use of input buffers to eliminate the effect of source resistances RS1, RS2 from the operation of difference amplifier 10. Preferably the input buffers provide high input resistance towards signal sources VS1, VS2 so as not to load the respective signal sources, and low output resistance to that EQ. 3 will reduce to EQ. 1.

FIG. 2 illustrates such an embodiment, where buffers 30 are provided between respective signal sources VS1, VS2 and input leads INPUT1, INPUT2, respectively of difference amplifier 10. Each buffer 30 is illustrated, without limitation, as a source follower circuit, comprising a current source, denoted ID, and a transistor, illustrated without limitation as an NMOSFET. For clarity, the transistor of buffer 30 connected to signal source VS1 is denoted M1, and the transistor of buffer 30 connected to signal source VS2 is denoted M2. In greater detail, the output of signal source VS1, illustrated for simplicity with source resistance RS1 in series with the positive output thereof, is connected to the gate of transistor M1. The drain of transistor M1 is connected to the common potential, illustrated without limitation as ground, and the source of transistor M1 is connected to the output of the respective current source ID and to input lead INPUT1 of difference amplifier 10, which is in all respects identical to difference amplifier 10 of FIG. 1. The output of signal source VS2, illustrated for simplicity with source resistance RS2 in series with the positive output thereof, is connected to the gate of transistor M2. The drain of transistor M2 is connected to the common potential, illustrated without limitation as ground, and the source of transistor M2 is connected to the output of the respective current source ID and to input lead INPUT2 of difference amplifier 10. The inputs of the respective current sources ID are connected to a voltage potential.

Use of a source follower circuit for buffer 30, as described above, provides simplicity and low cost, however it presents certain difficulties. In particular, the current through the respective transistors M1, M2 of buffers 30 is determined by:

$$IM = (k'/2)*(W/L)*(V_{GS} - V_t)^2 \quad \text{EQ. 4}$$

where k' and $V_t$ are constants of the respective transistors M1, M2; W is the width of the respective transistors M1, M2; L is the length of the respective transistors M1, M2; $V_{GS}$ represents the potential between the gate and source of the respective transistors M1, M2; and $V_t$ is the threshold voltage of the respective transistors M1, M2. As described above in relation to EQ. 2, differentially, the input resistance to difference amplifier 10 is 2*R1. A difference in output voltage between signal source VS1 and signal source VS2, translated into a voltage difference between INPUT1 and INPUT2, will result in a differential between the current passing through M1, denoted particularly as current IM1, and the current passing through M2, denoted particularly as current IM2. In greater detail:

$$IM1 - IM2 = (INPUT1 - INPUT2)/(2*R1) \quad \text{EQ. 5}$$

As indicated by EQ. 4, such a difference in current can only be manifested as a difference in $V_{GS}$ between M1 and M2, resulting in a systematic offset into the input of difference amplifier 10 as the difference between the source voltages of transistors M1 and M2 no longer represent solely the difference between the gate voltages of transistors M1 and M2, i.e. the difference between the source voltages of transistors M1 and M2 no longer represent solely the difference between signal source VS1 and signal source VS2.

Unfortunately, the prior art does not supply a difference amplifier arrangement which exhibits high input impedance without introducing any undesired offsets.

SUMMARY OF THE INVENTION

Accordingly, it is a principal object of the present embodiments to overcome at least some of the disadvantages of the prior art. This is provided in certain embodiments by an arrangement comprising a transconductance amplifier, a source follower input buffer and a difference amplifier. The input buffer is arranged to provide an advantageously high input impedance for the difference amplifier, and the transconductance amplifier is arranged to compensate for the offset outcome of the input buffer.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Figure 1:
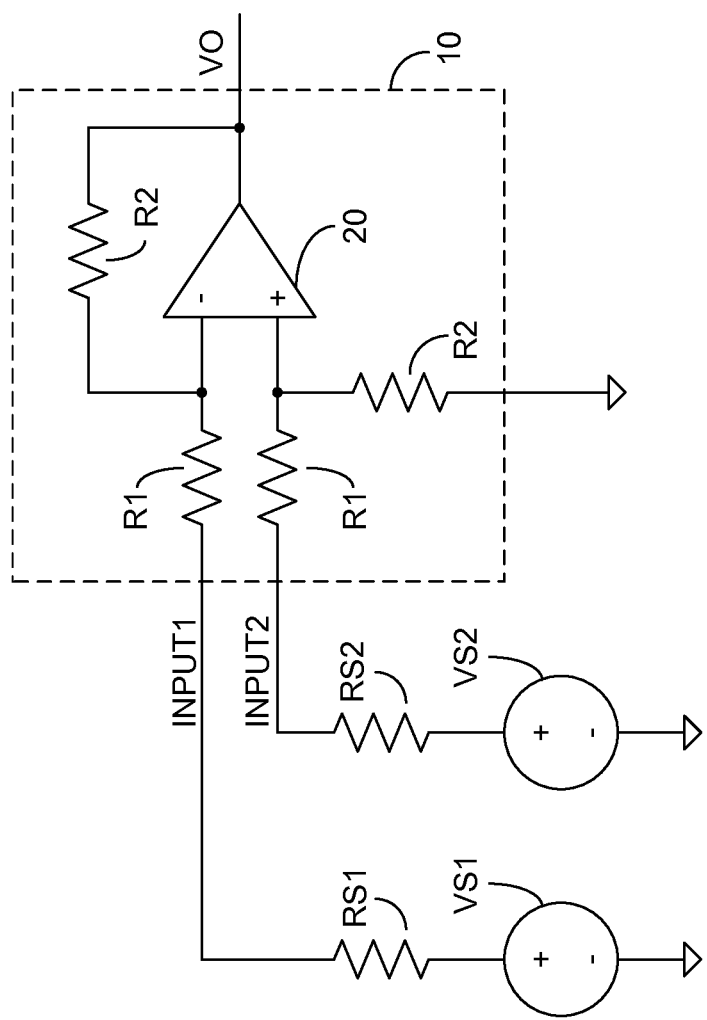
FIG. 1 illustrates a high level schematic diagram of a difference amplifier driven by a pair of signal sources each exhibiting a source impedance according to the prior art.
Figure 2:
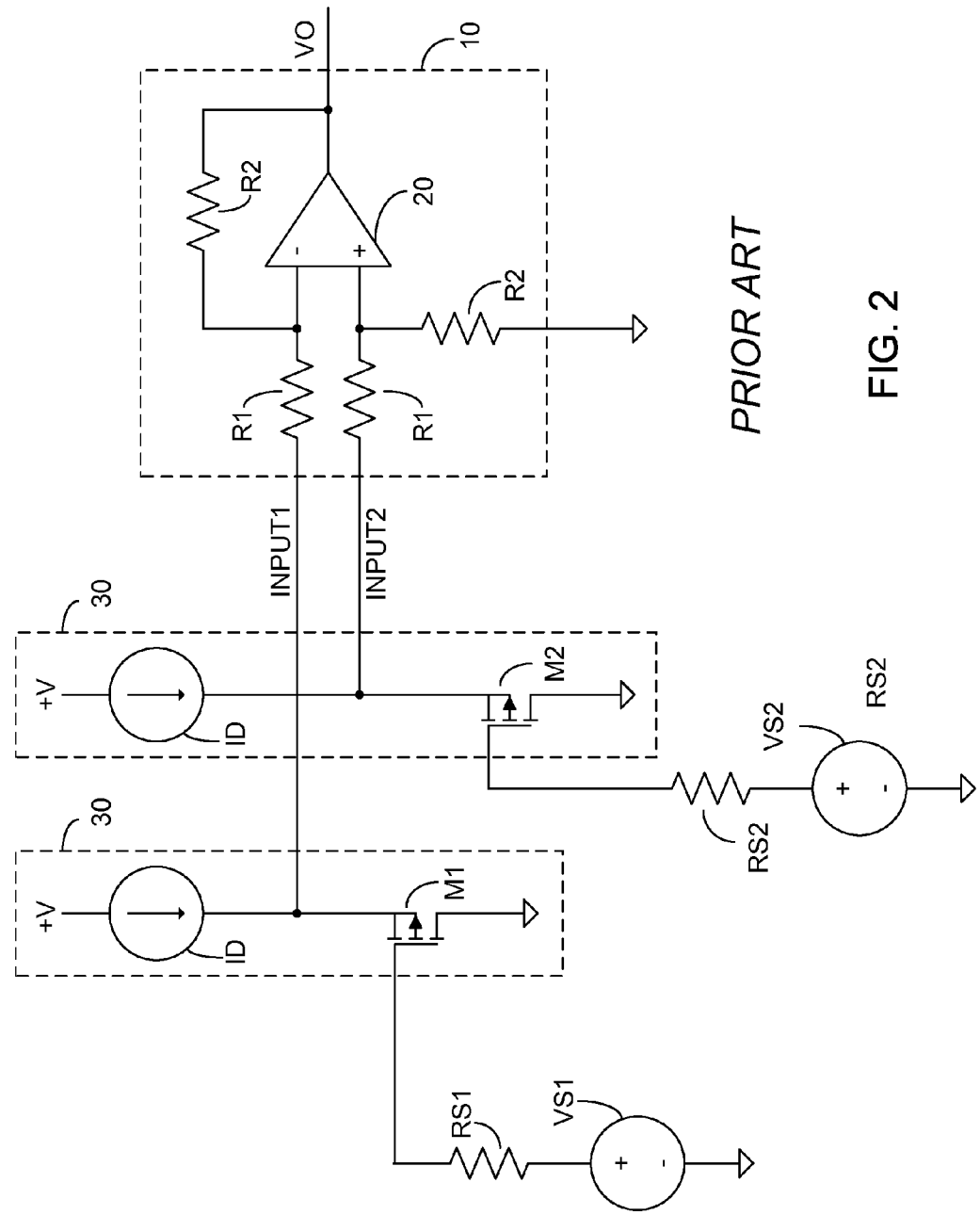
FIG. 2 illustrates a high level schematic diagram of a difference amplifier driven by a pair of signal sources with input buffers provided for each signal source input according to the prior art.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 3:
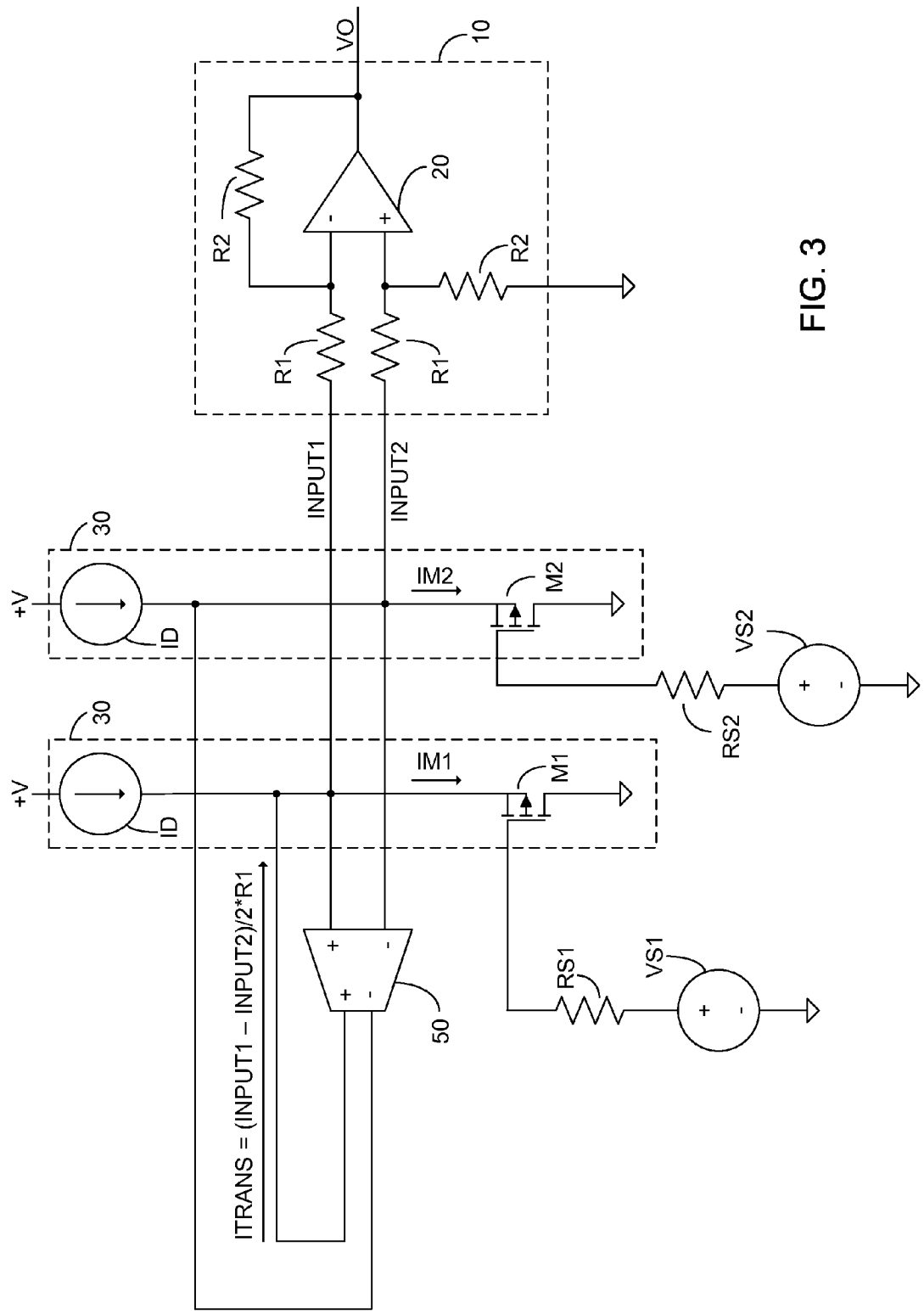
FIG. 3 illustrates a high level schematic diagram of an exemplary arrangement comprising a difference amplifier driven by a pair of signal sources with input buffers provided for each signal source input and a transconductance amplifier arranged to compensate for systematic offset provided by the input buffers.

FIG. 3 illustrates a high level schematic diagram of an arrangement comprising: a difference amplifier 10; a pair of signal sources VS1, VS2 each illustrated in series with a respective source impedance RS1, RS2; a pair of buffers 30; and a transconductance amplifier 50. Each buffer 30 comprises a current source ID and a MOSFET transistor, respectively denoted M1, M2, each illustrated particularly as a PMOSFET, without limitation, with buffer 30 arranged as a source follower circuit.

A first output of signal source VS1, denoted the positive output, is connected via source impedance RS1 to the gate of transistor M1, and a second output of signal source VS1 is connected to a common potential. A first output of signal source VS2, denoted the positive output, is connected via source impedance RS2 to the gate of transistor M2, and a second output of signal source VS2 is connected to the common potential. The drain of transistor M1 and the drain of transistor M2 are further connected to the common potential. The source of transistor M1 is connected to the output of the respective current source ID, to INPUT1 of difference amplifier 10, to the non-inverting input of transconductance amplifier 50 and to the non-inverted output of transconductance amplifier 50. The source of transistor M2 is connected to the output of the respective current source ID, to INPUT2 of difference amplifier 10, to the inverting input of transconductance amplifier 50 and to the inverted output of transconductance amplifier 50. The inputs of the respective current sources ID are connected to a positive potential. As described above, INPUT1 of difference amplifier 10 is connected via a respective resistor R1 to the inverting input of Op Amp 20 and INPUT2 of difference amplifier 10 is connected via a respective resistor R1 to the non-inverting input of Op Amp 20. The output of Op Amp 20, denoted VO and representing the output of difference amplifier 10, is connected via a respective resistor R2 to the inverting input of Op Amp 20, and the non-inverting input of Op Amp 20 is further connected via a respective resistor R2 to the common potential.

In operation, and as described above, the output of the respective signal sources VS1, VS2, are buffered by the operation of buffers 30 and as a result a high impedance is advantageously presented to signal sources VS1, VS2. The input resistance RIN of difference amplifier 10 is 2*R1, as described above in relation to EQ. 2, and as described above in relation to EQ. 5, the difference in current passing through transistors M1, M2, is IM1−IM2. Transconductance amplifier 50 preferably provides a gain of 1/(2*R1) and thus generates a current, defined in relation to the non-inverted output of transconductance amplifier 50, equal to:

$$ITRANS=(INPUT1-INPUT2)/(2*R1) \quad \text{EQ. 6}$$

thus precisely cancelling the offset of EQ. 5. As a result, current IM1 through transistor M1 is equal to current IM2 through transistor M2, and as a result the $V_{GS}$ of transistor M1 is equal to the $V_{GS}$ of transistor M2, as described above in relation to EQ. 4. As a result, the difference between the source voltages of transistors M1 and M2 represent the difference between the gate voltages of transistors M1 and M2, i.e. the difference between signal source VS1 and signal source VS2, and output VO of the arrangement of FIG. 3 is:

$$VO=R2/R1*(VS2-VS1), \text{ without any deviation caused by an offset.}$$

Figure 4:
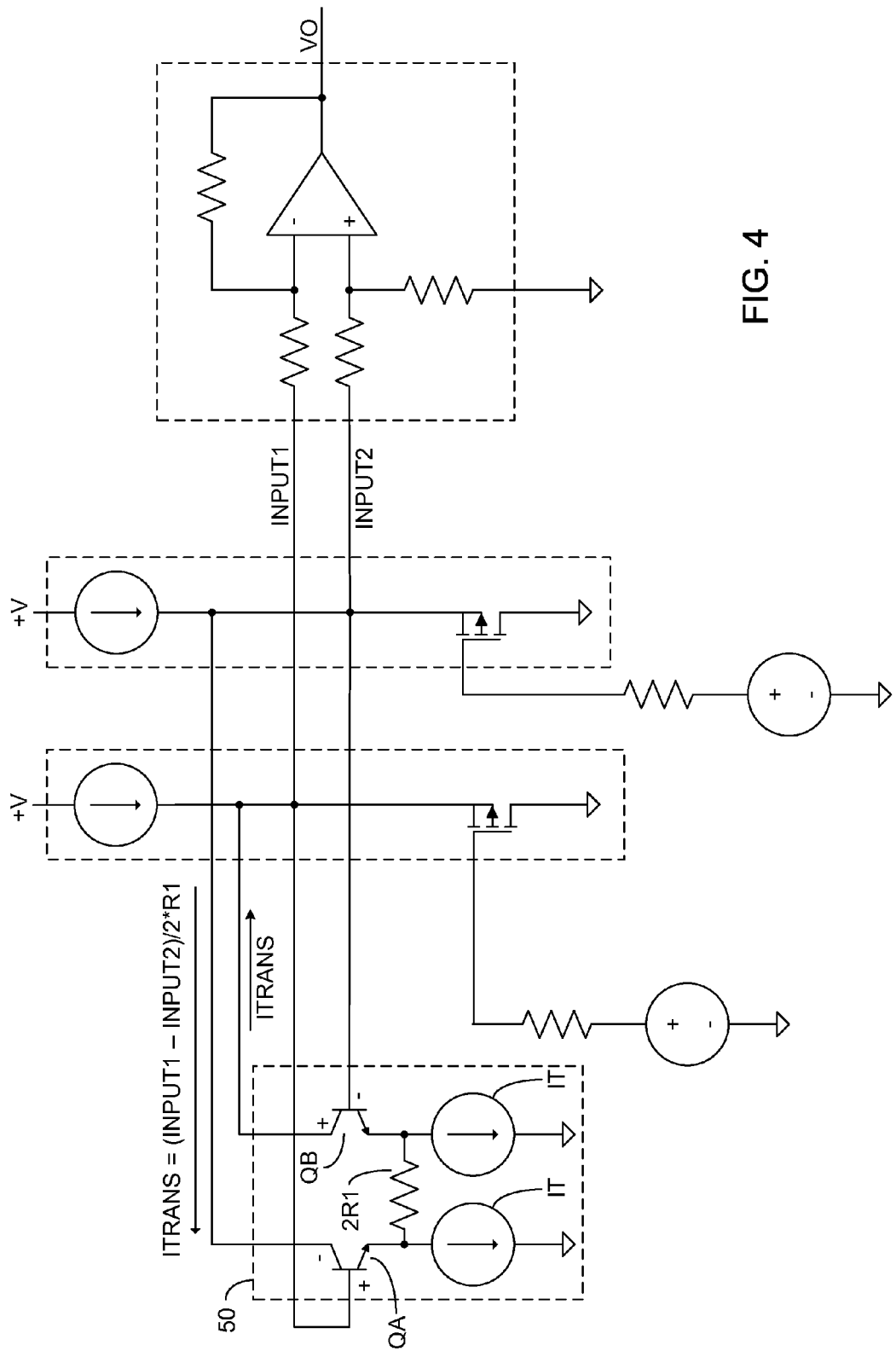
FIG. 4 illustrates a high level schematic diagram of the arrangement of FIG. 3, wherein the transconductance amplifier comprises a pair of transistors.

FIG. 4 illustrates a high level schematic diagram of the arrangement of FIG. 3, wherein transconductance amplifier 50 comprises a pair of transistors. In particular, transconductance amplifier 50 comprises: a pair of matched NPN transistors, respectively labeled QA and QB; a pair of current sources IT each associated with one of transistor QA and transistor QB; and a resistor 2R1 with a value of 2*R1. The base of transistor QA represents the non-inverting input of transconductance amplifier 50, and the collector of transistor QA represents the inverted output of transconductance amplifier 50. The base of transistor QB represents the inverting input of transconductance amplifier 50, and the collector of transistor QB represents the non-inverted output of transconductance amplifier 50. The emitter of transistor QA is connected to the input of the associated current source IT and to a first end of resistor 2R1. The emitter of transistor QB is connected to the input of the associated current source IT and to a second end of resistor 2R1. The output of each of the current sources IT are connected to the common potential.

Current sources IT each generate the same amount of current, and thus the difference between INPUT1 and INPUT2 manifests itself as current through resistor 2R1, which generates ITRANS. Such a transconductance amplifier thus exhibits the desired gain of $1/(2*R1)$ as described above in relation to FIG. 3, and is easily implemented, however those skilled in the art will recognize that other variant transconductance amplifiers may be utilized without exceeding the scope.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

We claim:

1. An amplifier arrangement comprising:
    a first input lead;
    a second input lead;
    a difference amplifier;
    a first buffer, the input of said first buffer coupled to said first input lead, the output of said first buffer coupled to a first input of said difference amplifier;
    a second buffer, the input of said second buffer coupled to said second input lead, the output of said second buffer coupled to a second input of said difference amplifier, wherein each of said first and second buffers comprise a respective transistor and a respective current source arranged as a source follower circuit; and
    a transconductance amplifier, the non-inverting input and the non-inverted output of said transconductance amplifier coupled to the first input of said difference amplifier, the inverting input and the inverted output of said transconductance amplifier coupled to the second input of said difference amplifier.

2. The amplifier arrangement according to claim 1, wherein the transconductance amplifier comprises a pair of transistors and a pair of current sources.

3. The amplifier arrangement according to claim 1, wherein the transconductance amplifier comprises a pair of transistors and a pair of current sources, each of said current sources connected to the emitter of a respective one of said transistors, and a resistor coupled between the emitters of the transistors.

4. The amplifier arrangement according to claim 1, wherein said difference amplifier comprises an operational amplifier, a feedback resistor, and a matched pair of input resistors.

5. A method of amplifying the difference between input signals, the method comprising:
    providing a first source follower circuit;
    providing a second source follower circuit;
    receiving a first signal;
    receiving a second signal;
    buffering said first signal with said provided first source follower circuit;
    buffering said second signal with said provided second source follower circuit;
    converting and amplifying the difference between said first buffered signal and said second buffered signal to generate a correction current;
    providing said correction current to said first and second source follower circuits so as to substantially cancel any generated offset; and
    amplifying the difference between said buffered first signal and said buffered second signal.

6. The method of claim 5, further comprising:
    providing a transconductance amplifier,
    said provided transconductance amplifier arrange to provide said converting and amplifying.

7. The method of claim 5, further comprising:
    providing an operational amplifier,
    said provided operational amplifier arranged to provide said amplifying the difference between said buffered first signal and said buffered second signal.

8. An amplifier arrangement comprising:
    a means for receiving a first signal;
    a means for receiving a second signal;
    a difference amplifier;
    a first buffer, the input of said first buffer coupled to said means for receiving a first signal, the output of said first buffer coupled to a first input of said difference amplifier;
    a second buffer, the input of said second buffer coupled to said means for receiving a second signal, the output of said second buffer coupled to a second input of said difference amplifier; and
    a transconductance amplifier comprising a pair of transistors and a pair of current sources, the non-inverting input and the non-inverted output of said transconductance amplifier coupled to the first input of said difference amplifier, the inverting input and the inverted output of said transconductance amplifier coupled to the second input of said difference amplifier.

9. The amplifier arrangement according to claim 8, wherein each of said current sources of said transconductance amplifier are connected to the emitter of a respective one of said transistors of said transconductance amplifier, and wherein the transconductance amplifier further comprises a resistor coupled between the emitters of the transistors of said transconductance amplifier.

10. The amplifier arrangement according to claim 9, wherein each of said buffers comprises a respective transistor and a current source arranged as a source follower circuit.

11. The amplifier arrangement according to claim 10, wherein said difference amplifier comprises an operational amplifier, a feedback resistor, and a matched pair of input resistors.

12. The amplifier arrangement according to claim 8, wherein each of said buffers comprises a respective transistor and a current source arranged as a source follower circuit.

13. The amplifier arrangement according to claim 8, wherein said difference amplifier comprises an operational amplifier, a feedback resistor, and a matched pair of input resistors.

\* \* \* \* \*